United States Patent [19]
Byrne et al.

[11] Patent Number: 6,051,284
[45] Date of Patent: Apr. 18, 2000

[54] CHAMBER MONITORING AND ADJUSTMENT BY PLASMA RF METROLOGY

[75] Inventors: Joshua Byrne, Los Altos; Tirunelveli S. Ravi, Santa Clara; Martin Seamons, San Jose; Eric Hanson, Santa Clara, all of Calif.

[73] Assignee: Applied Materials, Inc., Santa Clara, Calif.

[21] Appl. No.: 08/646,895

[22] Filed: May 8, 1996

[51] Int. Cl.[7] ............................. C23C 16/52; H05H 1/46
[52] U.S. Cl. .................... 427/569; 118/671; 118/690; 118/723 E; 134/1.1; 427/10; 427/585
[58] Field of Search ................... 118/663, 671, 118/690, 697, 698, 708, 712, 723 R, 723 E, 723 I, 723 MW; 364/468.21, 468.24, 483, 528.01, 528.03; 427/569, 8, 9, 10, 585; 134/1.1, 1.2

[56] References Cited

U.S. PATENT DOCUMENTS

| | | |
|---|---|---|
| 4,812,416 | 3/1989 | Hewig et al. ............................. 437/5 |
| 4,987,856 | 1/1991 | Hey et al. ............................... 118/723 |
| 5,091,217 | 2/1992 | Hey et al. ............................ 427/248.1 |
| 5,116,482 | 5/1992 | Setoyama et al. ................ 204/298.08 |
| 5,205,770 | 4/1993 | Lowrey et al. ........................... 445/24 |
| 5,292,393 | 3/1994 | Maydan et al. ........................ 156/345 |
| 5,458,732 | 10/1995 | Butler et al. ............................. 216/61 |
| 5,576,629 | 11/1996 | Turner et al. ........................... 324/709 |
| 5,665,166 | 9/1997 | Deguchi et al. .................... 118/723 E |

*Primary Examiner*—Jeffrey E. Russel
*Attorney, Agent, or Firm*—Townsend & Townsend & Crew

[57] ABSTRACT

A method and apparatus for monitoring a parameter of the RF power applied to a plasma-enhanced chemical vapor deposition (PECVD) chamber. The parameter is used to monitor an aspect of the chamber or a process in the chamber. In particular, the parameter can be used to determine whether the susceptor is properly aligned, determine the spacing of the susceptor from the gas discharge head, determine whether the wafer is properly aligned on the susceptor, determine whether there has been any deterioration of the susceptor or the gas discharge head, and determine whether a chamber clean operation is complete.

49 Claims, 7 Drawing Sheets

CHAMBER MONITORING AND ADJUSTMENT BY PLASMA RF METROLOGY

BACKGROUND OF THE INVENTION

The present invention relates to monitoring aspects of a plasma enhanced chemical vapor deposition (PECVD) chamber, including the alignment and spacing of a susceptor relative to a gas discharge head.

In a PECVD chamber, a semiconductor wafer is placed on a susceptor underneath a gas discharge head. Typically, an RF potential is established between the susceptor and the gas discharge head to enhance the deposition of chemicals which are introduced into the chamber in vapor form through the gas discharge head. In order to insure even deposition or reactions across the wafer surface, it is essential to have the susceptor parallel to and properly aligned with the gas discharge head. Even when properly aligned, the proper distance is also important, with different processes requiring different distances as a method of controlling the amount or power of the plasma generated.

Typically, a susceptor is manually adjusted before its first use, using a pair of control knobs which connect to perpendicular rods to adjust the level of the susceptor. The knobs, which extend through the chamber walls, are adjusted and the level of the susceptor can be measured with any of a number of different mechanical calibration tools. In one simple version, a flat bar is placed across ledges in a chamber and the spacing between the bar and the top of the susceptor is visually observed and adjusted to be even. Another necessary adjustment is the calibration height of the susceptor. Typically, the susceptor is mounted on fingers or a pedestal which are controlled by a motor to raise and lower the susceptor. This is done to both control the distance to be different for different processes, and to lower the susceptor for loading and unloading of wafers. Typically, wafers are loaded through a slot in the side of the chamber when the susceptor is lowered, and then the susceptor is raised up to the desired level under the control of electronic circuitry controlling the motor, which is itself guided by a software routine governing the process being run. Again, typically, the height of the susceptor is manually measured relative to the gas discharge head for a zero position of the electronic circuitry, with the calibration value being entered into the program for adjustment.

A final determination of whether the adjustment has properly aligned the susceptor is done by running test wafers through a deposition process, and then measuring the uniformity of the film deposited on the wafer. In one method, this is done by measuring 49 different points in a pattern across the wafer, and then dividing the standard deviation by the average thickness. A currently acceptable industry standard is that this quotient be no greater than 1.5%.

Typically, the entire alignment process, including running the test wafers, may take around 4–5 hours. This alignment not only needs to be done initially, but also periodically to insure that the susceptor stays aligned. Due to the periodic raising and lowering of the susceptor and the chemical reactions to which the chamber is subjected at varying pressures and temperatures, the susceptor typically becomes unaligned over a period of time, thus requiring periodic realignment. Such realignment requires stopping the process, cooling the chamber and breaking the vacuum, and opening the lid of the chamber in order to mechanically measure the alignment.

Accordingly, it would be desirable to have an alignment system which could be performed in a shorter time period and which would not require opening the chamber.

SUMMARY OF THE INVENTION

The present invention provides a method and apparatus for monitoring a parameter of the RF power applied to a plasma-enhanced chemical vapor deposition (PECVD) chamber. The parameter (e.g., voltage or current) is used to monitor an aspect of the chamber or a process in the chamber. In particular, the parameter can be used to determine whether the susceptor is properly aligned, determine the spacing of the susceptor from the gas discharge head, determine whether the substrate is properly aligned on the susceptor, determine whether there has been any deterioration of the susceptor or the gas discharge head, and determine whether a chamber clean operation is complete.

In one embodiment, the present invention provides a method and apparatus for determining the alignment of a susceptor relative to a gas discharge head without requiring that the chamber be opened or requiring any mechanical measurements. The alignment is determined by measuring a parameter of the power applied between the gas discharge head and the susceptor, and comparing it to a calibration band of values for a similar process. A parameter outside of the calibration band indicates misalignment, with the amount of alignment being either measurable from the difference in value, or being indeterminate but correctable by observation of the parameter while adjusting adjustment knobs on the exterior of chamber without opening the chamber.

In a preferred embodiment, both the voltage and the current applied to the gas discharge head during a nitrogen plasma process are measured for a properly aligned wafer and a series of different misalignments of the wafer within and without a predetermined acceptable variance. A band of values of voltage and current corresponding to the acceptable variation is then determined and used for comparison to actual values during later processing of wafers. Subsequently, a nitrogen plasma is periodically run in-between wafer processing without opening the chamber to determine whether the susceptor remains in alignment. The voltage and current values are compared to the originally determined band of values.

It has been determined that the current value is a good indicator of the planar alignment of the wafer or other substrate, while the voltage value is a good indicator of the vertical position of the susceptor relative to the gas discharge head. Accordingly, a current out of the predetermined band is used to indicate that an adjustment is required of the levelling knobs on the exterior of the chamber, while a voltage outside of the predetermined band indicates the need for an adjustment of the calibration value provided to the motor control circuit for raising and lowering the susceptor.

Alternately, a harmonic value of the current or voltage could be used, or different parameters of the power could be monitored. In one embodiment, the present invention allows the determination of whether a wafer or other substrate is properly aligned on the susceptor. This can be done by comparing the parameter of the power to a value corresponding to a properly aligned wafer. When the wafer is not properly aligned, the dielectric value of the gap between the gas discharge head and the susceptor will be different during a plasma. In addition, measurements of the parameters of the RF power can be used to compare to a base line value for a new susceptor and gas discharge head to determine whether either of those have become worn or damaged, thus affecting the plasma generated between them.

In yet another embodiment of the invention, the change in a parameter of the RF power can indicate the end of a chamber clean operation. Since particulate matter forming on the walls and other interior surfaces of the chamber act as a dielectric, the cleaning away of these deposits changes the dielectric value, and thus changes the amount of power needed to maintain the plasma. This can be monitored to determine when the particulate matter has been eliminated to indicate the end of a plasma clean operation.

For a further understanding of the objects and advantages of the invention, reference should be made to the ensuing detailed description taken in conjunction with the accompanying drawings.

DESCRIPTION OF THE SPECIFIC EMBODIMENT

Figure 1:
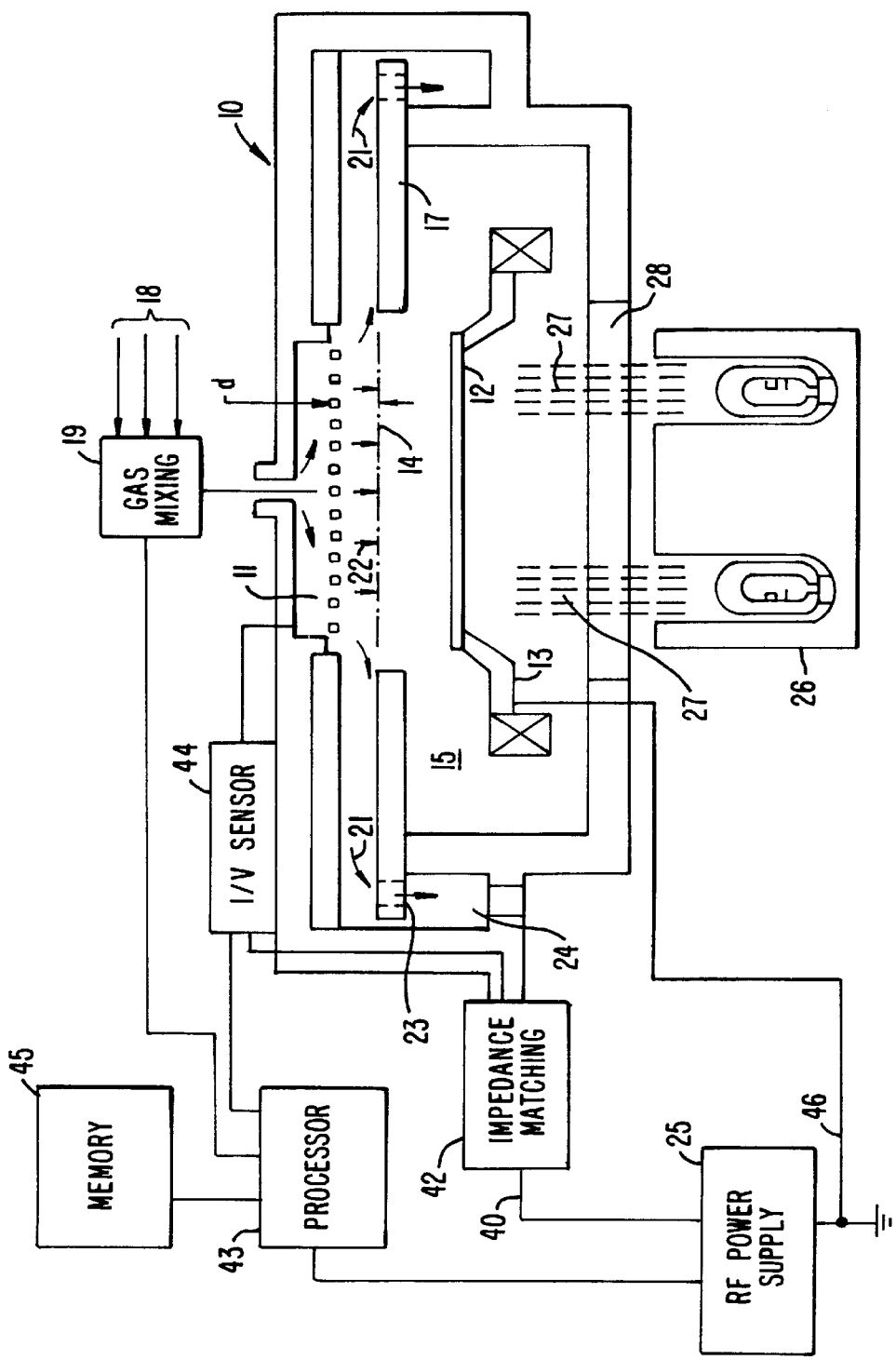
FIG. 1 is a side, sectional view of a typical CVD chamber incorporating the present invention.

FIG. 1 is a vertical, cross-sectional view of a simplified, parallel plate chemical vapor deposition (CVD) chamber 10. Chamber 10 contains a gas inlet manifold 11 for dispersing deposition gases to a wafer, not shown, that rests on a susceptor 12. Susceptor 12 is highly thermally responsive and is mounted on support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate 17 having a plurality of spaced holes 23 which exhaust into an annular vacuum manifold 24. During processing, gas provided to manifold 11 is uniformly distributed radially across the surface of the wafer as indicated by arrows 22. The gas is then exhausted via ports 23 into the circular vacuum manifold 24 as indicated by arrows 21 by a vacuum pump system (not shown). Before reaching manifold 11, deposition and carrier gases are input through gas lines 18 into a mixing system 19 where they are combined and then sent to manifold 11.

The deposition process performed in chamber 10 can be either a thermal process or a plasma enhanced process. In a plasma process, a controlled plasma is formed adjacent to the wafer by RF energy applied to inlet manifold 11 from RF power supply 25. Inlet manifold 11 is also an RF electrode, while susceptor 12 is grounded. RF power supply 25 can supply either single or dual frequency RF power to manifold 11 to enhance the decomposition of reactive species introduced into interior 15 of chamber 10.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition. Alternately, radiant resistive heating through a susceptor pedestal may be used.

Typically, any or all of the chamber lining, gas inlet manifold faceplate, support fingers 13, and various other reactor hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention, which is incorporated herein by reference for all purposes.

RF power supply 25 has its output line 40 connected to an impedance matching circuit 42 connected to the chamber 10. The present invention adds a current and voltage sensor 44 between impedance matching circuit 42 and the gas discharge head. The sensor is commercially available from Fourth State Technology, Austin, Tex., as Model RFMS. As in the prior art, the ground line 46 of the RF power supply is connected to the susceptor.

A processor 43 under control of a program in a memory 45 controls the operation of the chamber of FIG. 1, including the power supply, gas mixing system 19, and monitoring current and voltage sensor 44.

Figure 2:
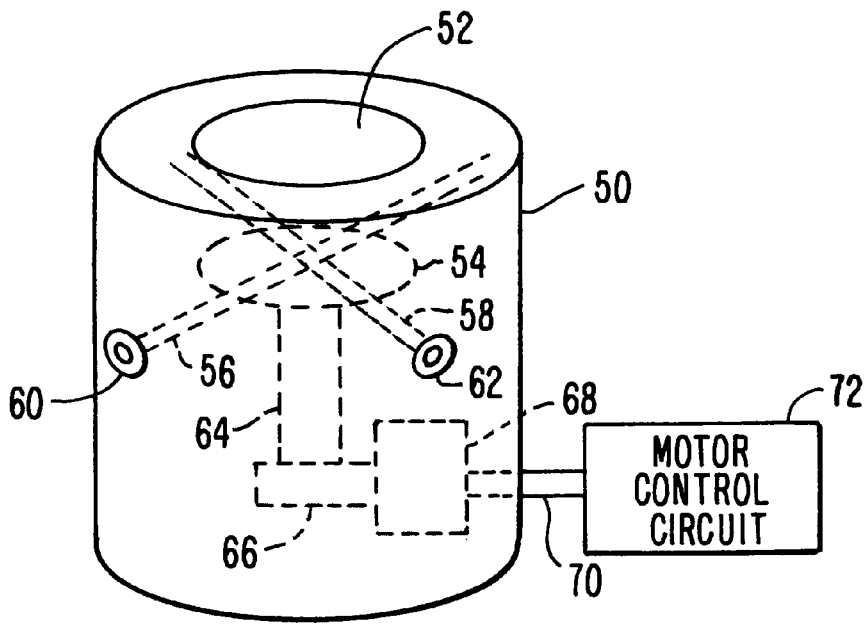
FIG. 2 is a diagram illustrating the adjustment knobs and susceptor stepper motor of the prior art controlled by the present invention.

FIG. 2 is an illustration of the prior art alignment mechanisms typically used. A chamber 50 is shown having a lid 52 with a gas discharge head. Shown in phantom inside, is a susceptor 54. The susceptor is levelled by perpendicular alignment rods 56 and 58, which are controlled, respectively, by knobs 60 and 62 which are external to the chamber. The height of the susceptor is adjusted by a pedestal or fingers 64, which are driven by a drive mechanism 66 connected to a stepper motor 68. The stepper motor is controlled by control lines 70 connected to a motor control circuit 72. Motor control circuit 72 can be controlled by processor 43 of FIG. 1.

Figure 3:
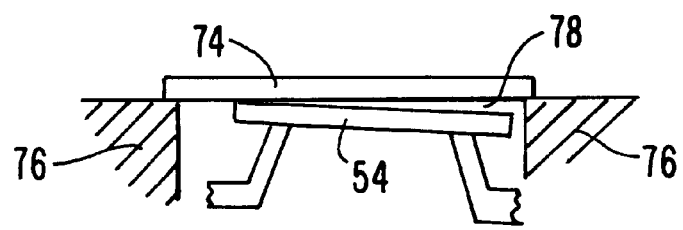
FIG. 3 is a diagram illustrating one prior art mechanical levelling system.

FIG. 3 illustrates a typical prior art alignment mechanism. A levelling bar 74 is positioned across interior ledges 76 inside the chamber. By visually observing the bar and the susceptor 54 from the side, the alignment can be determined by noticing whether there is an even gap or even contact with the levelling bar. In the diagram shown, there is a gap 78 on the right side, while there is no gap on the left side. By viewing the gap in the opened chamber from two different sides, the alignment can be adjusted by turning knobs 60 and 62 of FIG. 2, respectively. The height of the susceptor can be measured by any of various mechanical measuring tools, not shown. Alternately, the alignment could be measured by tools which provide some sort of a digital or analog indication of the height of different points, which can be read. However, the ultimate determination of alignment is done by processing a test wafer, and then carefully measuring the thickness of the wafer at multiple points on the wafer to determine the evenness of the layer deposited.

Figure 4:
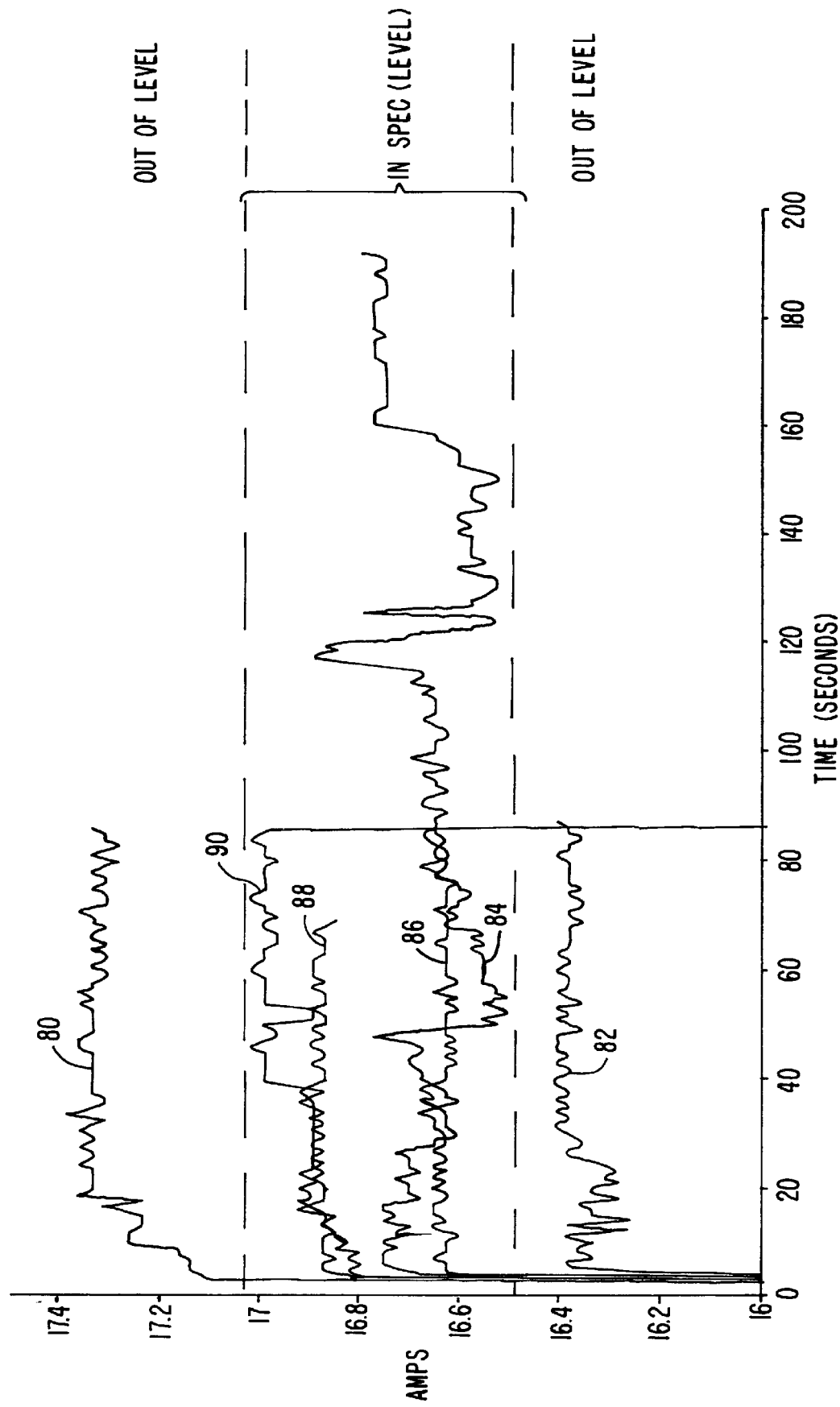
FIG. 4 is a graph illustrating the current supplied to the gas discharge head for different degrees of alignment according to the present invention.

FIG. 4 is a graph illustrating measured currents provided to gas inlet manifold 11 for a nitrogen plasma process with the susceptor deliberately set in different states of alignment or misalignment. In each case, the wafer was subsequently measured at 49 test points to determine whether the deposited layer was within the accepted variance. The process used injected $N_2$, and no other gases, into the chamber at a temperature of 400° C. and a pressure of 5 Torr with a power set point of 500 watts, at a frequency of 13.56 MHz. A nitrogen plasma is used, because nitrogen is an inert gas which does not react, but which provides a plasma which can be measured. Accordingly, nitrogen can be used in-between process steps without contaminating or otherwise adversely affecting the chamber. Thus, the same type of plasma, i.e. a plasma formed from nitrogen, is used both to calibrate susceptor alignment and to monitor susceptor alignment between process steps. Alternately, another type of plasma could be used.

FIG. 4 shows a current waveform 80 for current provided to the gas inlet manifold during a plasma with a first wafer which was subsequently determined to be out of alignment. As can be seen, the current averages approximately 17.3 amps. The measured current during a plasma with a second wafer in the chamber is indicated by current waveform 82. This second wafer was also out of alignment, with the average current value measured being approximately 16.4 amps. Waveforms 84, 86, 88 and 90 were generated while the chamber processed test wafers which were determined to be within the acceptable specification of deposition evenness. Accordingly, based on the test results as illustrated by FIG. 4, it is determined that a current value between approximately 16.5 and 17.03 amps for the above nitrogen plasma conditions indicates that the susceptor is within an acceptable alignment range for its planar, parallel alignment with the gas discharge head.

Figure 5:
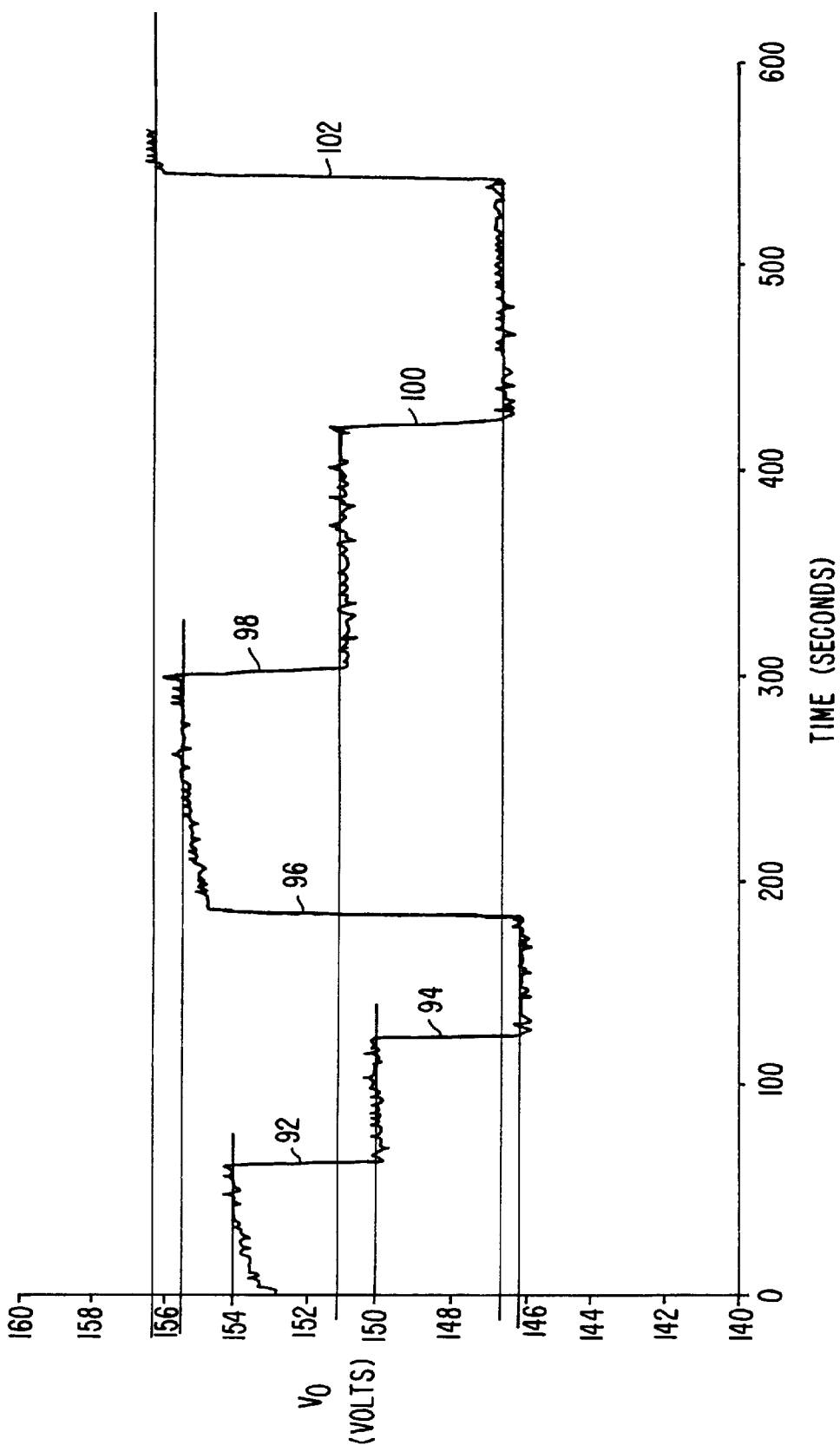
FIG. 5 is a graph illustrating the voltage applied to the gas discharge head for different susceptor heights as measured in accordance with the present invention.

FIG. 5 shows the voltage in volts applied to the gas inlet manifold versus time for the same nitrogen plasma conditions as used for FIG. 4. In the graph of FIG. 5, the height of the susceptor was adjusted under software control to different heights during the process, with the voltage being as shown in FIG. 5. The height was adjusted in a number of steps at points in time 92, 94, 96, 98, 100 and 102. Using the voltage values and vertical spacing settings indicated on the graph of FIG. 5, it can be determined that there is a correlation between voltage and separation of the susceptor and gas discharge manifold of approximately one volt per 25 mm.

The sensor current and voltage outputs illustrated in FIGS. 4 and 5 can be provided to an operator either on a graphical display on processor 43, on a printout, or as a numeric digital display. The operator can visually observe the readout and perform a manual adjustment on the levelling knobs and input a corrected calibration into the stepper motor control program for the vertical separation adjustment according to the measured parameter. Alternately, such an adjustment system could be fully automated, as illustrated in FIG. 6, to adjust the number of steps of the stepper motor in accordance with the parameter.

Figure 6:
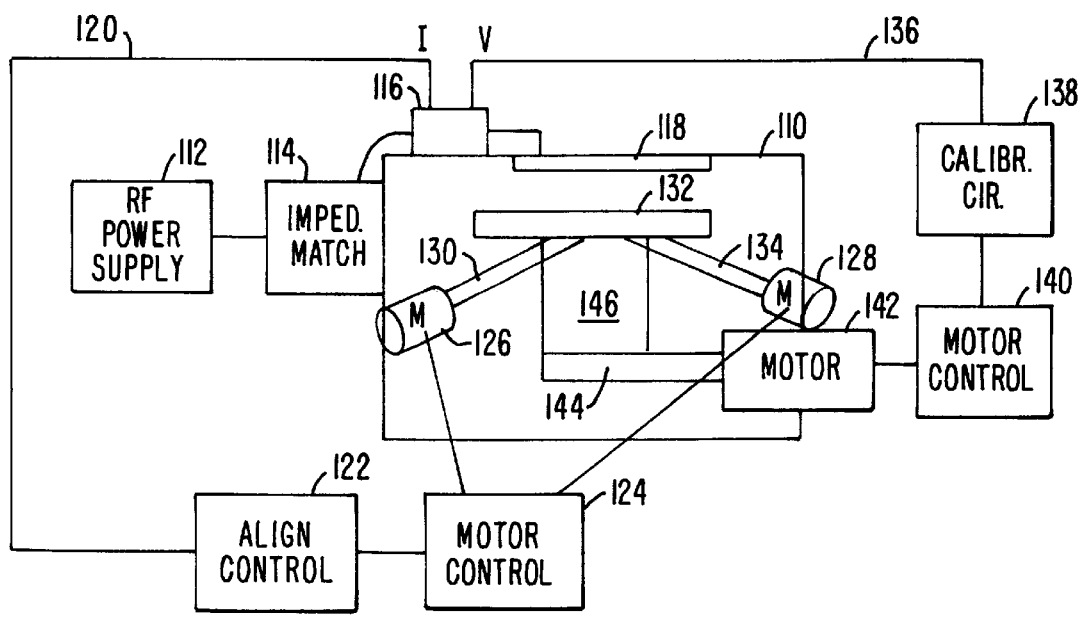
FIG. 6 is a block diagram illustrating an automatic adjustment system according to one embodiment of the present invention.

FIG. 6 shows a processing chamber 110 with an RF power supply 112 connected to an impedance matching circuit 114, which is in turn connected to the current and voltage sensor 116. Sensor 116 is connected to the gas discharge head (more particularly the faceplate) 118. The detected current from sensor 116 is provided on a control line 120 to an alignment control circuit 122. Alignment control circuit 122 (which could be processor 43 of FIG. 1) provides input to a motor control circuit 124 which controls two adjustment motors 126 and 128. Motor 126 controls adjustment rod 130 to level susceptor 132 along a first axis, while motor 128 controls an adjustment rod 134 to level susceptor 132 along a perpendicular axis.

A voltage output from sensor 116 is provided on a control line 136 to a calibration circuit 138. Calibration circuit 138 provides an input to a motor control circuit 140, which controls a motor 142. Motor 142 has a drive mechanism 144 which raises and lowers a pedestal or support fingers 146 connected to susceptor 132.

The above embodiments are merely examples of the application of the present invention. Although certain parameters of the power, e.g., voltage or current, may provide a clearer indication for certain chamber configurations, a different parameter may be more appropriate in a different environment. In addition, one or more harmonic values may be more indicative or useful than the fundamental frequency in certain configurations and situations. The RFMS sensor mentioned above samples at four different frequencies which are harmonics of its 13.56 mHz base frequency.

The present invention can also be applied to determining the mechanical condition of either the susceptor or the gas discharge head. The plasma will be less uniform if there is uneven wear, scratches or other damage to either the gas discharge head or the susceptor. By measuring the plasma, either with or without a wafer, these variations can be detected by comparison to a base line value done with a new susceptor and gas discharge head, or to any previous measurements of the same configuration.

The alignment of the wafer on the susceptor can also be determined by monitoring the RF parameters. If the wafer is offset from the susceptor, it is possible, for instance, for a portion of the susceptor to be exposed at one end of the wafer, while being covered at the other end. In particular, it has been observed that this misalignment of the wafer has a significant impact on the harmonics of the RF power.

Figure 7:
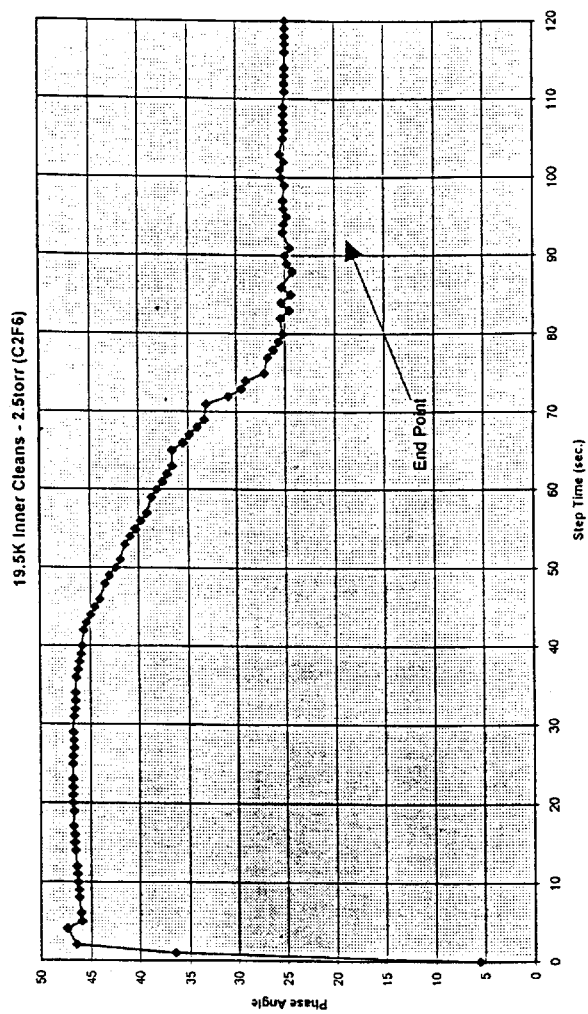
FIG. 7 is a graph of the RF phase angle versus time during a chamber clean operation.

In yet another application of the present invention, the end point of a chamber clean operation can be determined. Currently, chamber clean operations using a fluorine gas to etch particulate matter from the interior surfaces of a chamber are used. When the fluorine is doing its etching work, it is being consumed. When it is no longer consumed, the fluorine will emit a certain wavelength of light which can be detected by a light detector. An increase and levelling off of this emission can indicate the end point of a chamber clean operation. Such an apparatus requires a viewing port into the chamber to allow the light detector to observe the fluorine emissions. Using the present invention, on the other hand, no such light detector or viewing port is required. Instead, the RF signal can be monitored to determine the end of a chamber clean operation. FIG. 7 illustrates the phase angle of the RF signal with respect to time, in seconds, during a chamber clean operation. As can be seen, the phase angle starts at a value of above 45°, and then slowly declines to a plateau level of 25°. The 25° angle indicates that the chamber clean operation has been completed in the particular configuration for which FIG. 7 was generated.

Figure 8:
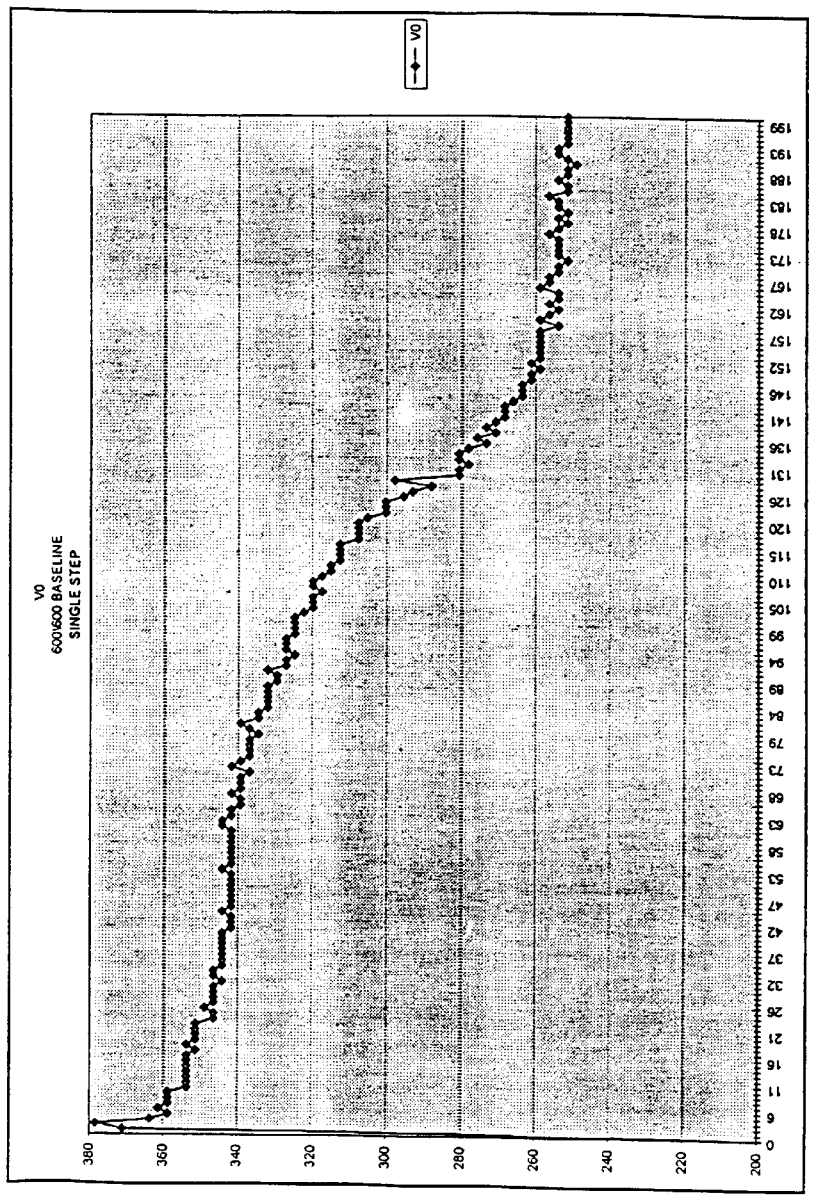
FIG. 8 is a diagram of the RF voltage versus time for a chamber clean operation.

Similarly, FIG. 8 shows the fundamental voltage of an RF signal applied to a chamber during a clean operation. As can be seen, the voltage declines during the clean operation until it levels out at a value of approximately 250 volts. The reason for the change is that the particulate matter on the interior surfaces of the chamber acts as a dielectric, affecting the voltage and other parameters of the power applied between the gas discharge head and the susceptor. As the clean operation removes this particulate matter, the amount of voltage required to be applied to overcome the dielectric and maintain the plasma is reduced, and other factors of the RF power change as well. The particular phase angle, voltage or other parameters that change, and the value of the changes, will vary from chamber to chamber depending upon the particular chamber configuration.

As can be seen, a single sensor providing multiple parameters of the power can be used for multiple operations. Before a wafer is inserted in the chamber, or even after a wafer is inserted, the parameters can be observed to determine if the susceptor is properly aligned and is at the proper spacing from the gas discharge head. After the wafer has been inserted, the parameters of the power can again be observed to determine whether the wafer is properly aligned on the susceptor. In addition, in-between or during processing of wafers, the parameters can be observed and compared to earlier values to determine if there is wear or damage to the susceptor and the gas discharge head. Finally, during chamber clean operations in-between the processing of wafers, the RF power parameters can be observed to determine the end point of the clean operation.

As will be understood by those of skill in the art, the present invention can be embodied in other specific forms without departing from the spirit or essential characteristics thereof. For example, the sensor might monitor the power or wattage applied to the gas discharge head, rather than voltage and current. In addition, one of the harmonic signals may be monitored rather than the fundamental frequency signal. Alternately, the sensor could be connected to the grounded susceptor, rather than the gas discharge head. Accordingly, the above description of the preferred embodiments is merely illustrative of the invention, and for an understanding of the scope of the invention, reference should be made to the following claims.

What is claimed is:

1. A chemical deposition chamber comprising:
   a susceptor for holding a semiconductor wafer;
   a gas discharge head mounted opposite said susceptor;
   a radio frequency ("RF") power supply having a first RF output line electrically coupled to said gas discharge head and a second RF output line electrically coupled to said susceptor; and
   a sensor, electrically coupled to at least one of said first and second RF output lines, for providing an indicator signal indicating the value of a parameter of RF power applied to one of said gas discharge head and said susceptor.

2. A chemical deposition chamber comprising:
   a susceptor for holding a semiconductor wafer;
   a gas discharge head mounted opposite said susceptor;
   a first RF output line coupled to said gas discharge head;
   a second RF output line coupled to said susceptor;
   a sensor, coupled to one of said first and second RF output lines, for providing an indicator signal indicating the value of a parameter of power applied to one of said gas discharge head and said susceptor; and
   a comparator configured to compare said indicator signal to a value, the value corresponding to an alignment of said susceptor.

3. The chamber of claim 2 wherein said parameter is a current indicating a planar alignment of said susceptor.

4. The chamber of claim 1 further comprising a comparator configured to compare said indicator signal to a second value, the second value corresponding to a spacing of said susceptor from said gas discharge head.

5. The chamber of claim 4 wherein said parameter is a voltage indicating an average spacing of said susceptor and said gas discharge head.

6. The chamber of claim 1 further comprising means for comparing said indicator signal to a value corresponding to a placement of a wafer on said susceptor.

7. The chamber of claim 1 further comprising a comparator configured to compare said indicator signal to a value corresponding to a mechanical condition of said susceptor or said gas discharge head.

8. The chamber of claim 1 further comprising a monitor configured to monitor said indicator signal for a change corresponding to the completion of a chamber clean operation.

9. The chamber of claim 1 wherein said sensor is coupled to said gas discharge head.

10. The chamber of claim 1 wherein said second RF output line is grounded and further comprising:
    an impedance matching circuit electrically coupled to said first RF output line; and
    said sensor being electrically coupled between said impedance matching circuit and said gas discharge head.

11. The chamber of claim 10 wherein said sensor provides a voltage measurement indicating an average spacing of said susceptor and said gas discharge head and a current measurement indicating a planar alignment of said susceptor.

12. The chamber of claim 1 further comprising:
    a motor coupled to said susceptor for raising and lowering said susceptor;
    a motor control circuit, coupled to said motor, for controlling the operation of said motor; and
    an alignment circuit, coupled between said sensor and said motor control circuit, for providing a calibration signal to said motor control circuit.

13. The chamber of claim 1 further comprising:
    a first motor coupled to said susceptor for adjusting the planar alignment of said susceptor along a first axis of said susceptor;
    a second motor coupled to said susceptor for adjusting the planar alignment of said susceptor along a second axis, perpendicular to said first axis, of said susceptor; and
    a planar alignment control circuit, coupled between said sensor and said first and second motors.

14. A plasma-enhanced chemical vapor deposition chamber with a susceptor alignment indicator comprising:
    a susceptor for holding a semiconductor wafer;
    a gas discharge head mounted opposite said susceptor;
    an RF power supply having a ground node coupled to said susceptor and a power output;
    an impedance matching circuit coupled to said RF power supply power output;
    a motor coupled to said susceptor for adjusting a height of said susceptor;
    a motor control circuit coupled to said motor for controlling operation of said motor;
    first and second alignment rods, connected to said susceptor at a right angle to each other;
    a voltage sensor, coupled between said impedance matching circuit and said gas discharge head, for providing a vertical calibration signal; and
    a current sensor, coupled between said impedance matching circuit and said gas discharge head, for providing a planar calibration signal.

15. A method for use in a chemical deposition chamber having a gas discharge head mounted opposite a susceptor, an RF power supply having a first RF output line electrically coupled to said gas discharge head, and a second RF output line electrically coupled to said susceptor, said method comprising steps of:

detecting a first value of a parameter of RF power applied to one of said gas discharge head and said susceptor;

comparing said parameter to a second value; and providing an indicator signal based on said comparing step.

16. A method for use in a chemical deposition chamber having a gas discharge head mounted opposite a susceptor, an RF power supply having a first RF output line coupled to said gas discharge head, and a second RF output line coupled to said susceptor, said method comprising:

detecting a first value of a parameter of RF power applied to one of said gas discharge head and said susceptor;

comparing said parameter to a second value;

providing an indicator signal based on said comparing step;

determining a band of values of said parameter indicating an acceptable alignment range, the acceptable alignment range being capable of producing a film on a wafer with an average thickness of the film and a standard deviation of thickness of the film, a quotient of the standard deviation divided by the average thickness being less than or equal to about 1.5%;

periodically monitoring said parameter to determine if the first value of said parameter is within said band; and adjusting the alignment of said susceptor when said first value is outside said band.

17. The method of claim 16 wherein said detecting step and said monitoring step are both performed during a plasma process, the plasma process using a plasma precursor.

18. The method of claim 17 wherein said plasma precursor is nitrogen.

19. The method of claim 16 further comprising steps of:

performing said detecting step during a first plasma process;

performing said monitoring step during a second plasma process; and correlating said band for said first plasma process to a band for said second plasma process.

20. The method of claim 15 wherein said parameter is a voltage indicating an average spacing of said susceptor and said gas discharge head.

21. The method of claim 15 wherein said parameter is a current indicating a planar alignment of said susceptor.

22. The method of claim 15 further comprising steps of:

raising and lowering said susceptor in a number of steps; and adjusting the number of said steps in accordance with said parameter.

23. The method of claim 16 further comprising performing, in response to said first value being outside said band, steps of:

adjusting the planar alignment of said susceptor along a first axis of said susceptor;

adjusting the planar alignment of said susceptor along a second axis, perpendicular to said first axis, of said susceptor; and monitoring said first value after said adjusting steps and repeating said adjusting steps as necessary until said first value is within said band.

24. The method of claim 15 wherein said parameter corresponds to a placement position of a wafer on said susceptor.

25. The method of claim 15 wherein said second value corresponds to a mechanical condition of said susceptor or said gas discharge head.

26. The method of claim 15 wherein said second value corresponds to the completion of a chamber clean operation.

27. A substrate processing chamber comprising:

a gas discharge head;

a susceptor;

a radio frequency ("RF") power supply having a first RF output line electrically coupled to said gas discharge head and a second RF output line electrically coupled to said susceptor;

a sensor coupled to one of said first and second RF output lines for detecting the value of a parameter of RF power applied to one of said gas discharge head and said susceptor;

a processor coupled to said sensor;

a memory coupled to said processor and storing a program, said program including instructions for detecting said parameter;

comparing said parameter to a value; and providing an indicator signal based on said comparing instruction.

28. A substrate processing chamber comprising:

a gas discharge head;

a susceptor;

a radio frequency ("RF") power supply having a first RF output line electrically coupled to said gas discharge head and a second RF output line electrically coupled to said susceptor;

a sensor coupled to one of said first and second RF output lines for detecting the value of a parameter of RF power applied to one of said gas discharge head and said susceptor;

a processor coupled to said sensor;

a memory coupled to said processor and storing a program, said program including instructions for detecting said parameter;

comparing said parameter to a value;

providing an indicator signal based on said comparing instruction;

determining a band of values of said parameter indicating an acceptable alignment range, the acceptable alignment range being capable of producing a film on a wafer with an average thickness of the film and a standard deviation of thickness of the film, a quotient of the standard deviation divided by the average thickness being less than or equal to about 1.5%; and periodically monitoring said parameter to determine if the value of said parameter is within said band.

29. The chamber of claim 28 wherein said program further comprises instructions for:

performing said detecting step during a first plasma process and said monitoring step during a second plasma process, the first plasma process and the second plasma process using a plasma precursor.

30. The chamber of claim 29 wherein said plasma precursor is nitrogen.

31. The chamber of claim 28 wherein said program further comprises instructions for:

performing said detecting step during a first plasma process;

performing said monitoring step during a second plasma process; and correlating said band for said first plasma process to a band for said second plasma process.

32. The chamber of claim 27 wherein said parameter is a voltage indicating an average spacing of said susceptor and said gas discharge head.

33. The chamber of claim 27 wherein said parameter is a current indicating a planar alignment of said susceptor.

34. The chamber of claim 27 wherein said program further comprises instructions for:
   raising and lowering said susceptor in a number of steps; and
   adjusting the number of said steps in accordance with said parameter.

35. The chamber of claim 28 wherein said program further comprises instructions for, in response to said parameter value being outside said band:
   adjusting the planar alignment of said susceptor along a first axis of said susceptor;
   adjusting the planar alignment of said susceptor along a second axis, perpendicular to said first axis, of said susceptor; and
   monitoring said parameter value after said adjusting steps and repeating said adjusting steps as necessary until said parameter value is within said band.

36. The chamber of claim 27 wherein said value corresponds to a placement position of a wafer on said susceptor.

37. The chamber of claim 27 wherein said value corresponds to a mechanical condition of said susceptor or said gas discharge head.

38. The chamber of claim 27 wherein said value corresponds to a completion of a chamber clean operation.

39. A memory storing a program for access by a processor controlling a substrate processing chamber, the chamber including a gas discharge head, a susceptor, a radio frequency ("RF") power supply having a first RF output line electrically coupled to said gas discharge head and a second RF output line electrically coupled to said susceptor, and a sensor coupled to one of said first and second RF output lines for detecting the value of a parameter of RF power applied to one of said gas discharge head and said susceptor, said program comprising:
   an instruction for comparing said parameter to a value;
   an instruction for providing an indicator signal based on said comparing instruction;
   an instruction for determining a band of values of said parameter indicating an acceptable alignment range, the acceptable alignment range being capable of producing a film on a wafer with an average thickness of the film and a standard deviation of thickness of the film, a quotient of the standard deviation divided by the average thickness being less than or equal to about 1.5%; and
   an instruction for periodically monitoring said parameter to determine if the value of said parameter is within said band.

40. The memory of claim 39 wherein said program further comprises an instruction for performing said detecting step during a first plasma process and said monitoring step during a second plasma process, the first plasma process and the second plasma process using a plasma precursor.

41. The memory of claim 40 wherein said plasma precursor is nitrogen.

42. The memory of claim 39 wherein said program further comprises:
   an instruction for performing said detecting step during a first plasma process;
   an instruction for performing said monitoring step during a second plasma process; and
   an instruction for correlating said band for said first plasma process to a band for said second plasma process.

43. The memory of claim 39 wherein said parameter is a voltage indicating an average spacing of said susceptor and said gas discharge head.

44. The memory of claim 39 wherein said parameter is a current indicating a planar alignment of said susceptor.

45. The memory of claim 39 wherein said program further comprises:
   an instruction for raising and lowering said susceptor in a number of steps; and
   an instruction for adjusting the number of said steps in accordance with said parameter.

46. The memory of claim 39 wherein said program further comprises, in response to said parameter value being outside said band:
   an instruction for adjusting the planar alignment of said susceptor along a first axis of said susceptor;
   an instruction for adjusting the planar alignment of said susceptor along a second axis, perpendicular to said first axis, of said susceptor; and
   an instruction for monitoring said parameter value after said adjusting steps and repeating said adjusting steps as necessary until said parameter value is within said band.

47. The memory of claim 39 wherein said value corresponds to a placement position of a wafer on said susceptor.

48. A memory storing a program for access by a processor controlling a substrate processing chamber, the chamber including a gas discharge head, a susceptor, a first RF output line coupled to said gas discharge head, a second RF output line coupled to said susceptor, and a sensor coupled to one of said first and second nodes for detecting the value of a parameter of power applied to one of said gas discharge head and said susceptor, said program comprising:
   an instruction for comparing said parameter to a value, said value corresponding to a condition of said susceptor or said gas discharge head; and
   an instruction for providing an indicator signal based on said comparing instruction.

49. A memory storing a program for access by a processor controlling a substrate processing chamber, the chamber including a gas discharge head, a susceptor, a first RF output line coupled to said gas discharge head, a second RF output line coupled to said susceptor, and a sensor coupled to one of said first and second nodes for detecting the value of a parameter of power applied to one of said gas discharge head and said susceptor, said program comprising:
   an instruction for comparing said parameter to a value, said value corresponding to the completion of a chamber clean operation; and
   an instruction for providing an indicator signal based on said comparing instruction.

* * * * *